United States Patent [19]
Straayer et al.

[11] Patent Number: 5,506,793
[45] Date of Patent: Apr. 9, 1996

[54] METHOD AND APPARATUS FOR DISTORTION COMPENSATION IN AN AUTOMATIC OPTICAL INSPECTION SYSTEM

[75] Inventors: Ronald J. Straayer, South Windsor; Scott P. Snietka, Andover; Peter M. Walsh, South Windsor; James P. Kohler, Southbury, all of Conn.

[73] Assignee: Gerber Systems Corporation, South Windsor, Conn.

[21] Appl. No.: 182,842

[22] Filed: Jan. 14, 1994

[51] Int. Cl.⁶ ........................................ G06F 19/00
[52] U.S. Cl. .................... 364/571.01; 348/125; 348/126; 348/129; 348/130; 364/552; 382/141; 382/145; 382/147
[58] Field of Search .............................. 348/87, 125, 126, 348/129, 130; 356/237; 364/552, 571.01, 571.02; 382/8, 141, 145, 146, 147, 151

[56] References Cited

U.S. PATENT DOCUMENTS

| | | | |
|---|---|---|---|
| 4,586,141 | 4/1986 | Yasuda et al. | 364/490 |
| 4,628,466 | 12/1986 | Tymes | 364/571.02 X |
| 4,835,704 | 5/1989 | Eichelberger et al. | 364/490 |
| 5,023,917 | 6/1991 | Bose et al. | 382/8 |
| 5,157,762 | 10/1992 | Snietka | 395/129 |
| 5,163,128 | 11/1992 | Straayer | 348/126 X |

Primary Examiner—Edward R. Cosimano
Attorney, Agent, or Firm—McCormick, Paulding & Huber

[57] ABSTRACT

A method and apparatus for compensating substrate distortion in automatic optical inspection (AOI) systems eliminates false error signals during printed circuit boards (PCB) defect detection. The present invention is used in feature edge transition AOI systems that employ pixel to pixel comparison between CAD and scanned PCB feature databases. The present invention divides the substrate into a plurality of regions or "tiles". A distortion vector for each tile is calculated and is used to generate a shift of pixels within each tile which removes any variation between the preferred pixel location and the actual pixel location, thereby enabling the AOI system to avoid generating error signals when features are only misplaced on the substrate.

14 Claims, 4 Drawing Sheets

METHOD AND APPARATUS FOR DISTORTION COMPENSATION IN AN AUTOMATIC OPTICAL INSPECTION SYSTEM

TECHNICAL FIELD

This invention relates to automatic optical inspection systems used with the production of printed circuit boards (PCB), and more particularly to a system which provides compensation for localized distortion in PCB substrates.

CROSS REFERENCE TO RELATED APPLICATIONS

Some of the subject matter of the present invention is disclosed and claimed in the following commonly owned U.S. patents and pending U.S. patent applications, all incorporated herein by reference:

U.S. Pat. No. 5,163,128
U.S. Pat. No. 5,157,762
U.S. patent application Ser. No. 08/143,434

BACKGROUND OF THE INVENTION

Printed circuit boards are today manufactured by a process which is almost completely automated. The circuits for a particular printed circuit board are generated using a computer aided design (CAD) machine which will not only generate a schematic of the printed circuit board but also will provide the board layout for all of the devices thereon. The printed circuit board layout information is provided to a device such as a laser plotter which exposes the artwork needed to fabricate the printed circuit board. The artwork comprises a series of transparent and opaque areas as features corresponding to the PCB devices.

However, defects may be present in the printed circuit board or the PCB artwork which would render the printed circuit board useless. These defects can have a variety of causes, including shrinkage in the artwork or failures in the fabrication process. Many known systems for defect detection in printed circuit boards simply compare a given printed circuit board against a reference, defect free printed circuit board (i.e. golden board) to detect errors created during the fabrication process. A Golden Board System does not detect errors in subsequent boards that were also in the golden board.

Some of the known optical PCB inspection systems are configured to examine inspection marks which are placed on the artwork away from the features. The dimensions and locations of the registration marks on the printed circuit board are compared against a reference to determine the extent of shrinkage or expansion. Should the variation in dimension exceed a certain value, the board is considered by these systems to be defective.

Most known systems used for automatic optical inspection (AOI) of PCBs are rule based systems. In a given scan line, these systems analyze scanned PCB features for their width, in pixels, and compare that measured width with one having a preferred width. To establish the existence of an error, a second class of AOI systems are edge based in that they look for state transitions across a scan line (e.g., white to black) which correspond to feature edges without constructing "features" per se.

Edge based transition systems employ a pixel to pixel comparison between the pixels in the CAD data base and those corresponding pixels that are scanned from the substrate. In order for these systems to work properly, there must be very high fidelity between the scanned and CAD data base pixels. That is; the location of the scanned pixel on the substrate should exactly correspond to that of the CAD pixel in the data base. Should this condition not be met, an error signal may be generated.

The causes of this distortion are numerous. A substrate itself may be distorted or the artwork employed may have been produced out of calibration. Other factors which yield imperfections are temperature or humidity variations from ideal conditions as well as distortion which could occur during the substrate etching process. Importantly, the distortion may not be continuous and extend entirely across a substrate or a panel, but may, instead, be localized in one or more areas. Moreover, the type, i.e., radial versus linear, may vary as can respective magnitudes. Many printed circuit board fabrication lines employ a panel containing 8–12 printed circuit boards. It is entirely conceivable that slight distortions could result in for example, an end substrate on the panel or/and circuit on the substrate being misregistered by one or more pixels.

It would be advantageous to have a method and apparatus for creating a database from the original raster CAD data for use in detection of distortion in printed circuit boards which would provide the capability of correcting for localized substrate distortion. The present invention is directed towards such a method and apparatus.

SUMMARY OF INVENTION

An object of the present invention is to provide a method and apparatus for use with printed circuit board automatic optical inspection systems having the capability of correcting for localized distortions in a substrate.

Another object of the present invention is to provide a system of the foregoing type wherein pixels are configured in a plurality of tile regions that subdivide the substrate surface.

Still another object of the present invention is to provide a system of the foregoing type wherein each scanned pixel signal is compared against a corresponding CAD database pixel signal to establish a local distortion vector.

According to the present invention, a substrate distortion compensation apparatus for use in an automatic optical inspection (AOI) system includes a device for receiving pixel signals indicative of a database of features of preferred dimension and location to be fabricated on said substrate. The preferred dimension database signals include signals corresponding to pixels spaced across said substrate in a sequence of scan lines, with the features demarked by pixel state transitions. There is also a mechanism for grouping the preferred dimension database signals into a plurality of signal arrays corresponding to tile regions of the substrate and another mechanism for receiving pixel signals indicative of a database of features scanned from the substrate. The present system also includes an apparatus for grouping the scanned database signals into a plurality of signal arrays corresponding to tile regions of the substrate and a device for comparing a preferred tile region signal array with a corresponding scanned tile region. A device is provided for generating distortion vector signals indicative of a variation in scanned pixel location from the preferred pixel location as well as a mechanism for generating signals for presentation to the AOI system for removing the pixel location variation during substrate defect detection.

According to another aspect of the present invention, a method for use in calibrating PCB fabrication apparatus includes the steps of generating a calibration substrate having features of preferred dimension and location. The features include pixels spaced across the calibration substrate in a sequence of scan lines, with the features demarked by pixel state transitions. The method also includes the steps of receiving pixel signals indicative of a database of features of preferred dimension and location to be fabricated on the calibration substrate, receiving pixel signals indicative of a database of features scanned from the calibration substrate and grouping the scanned database signals into a plurality of signal arrays corresponding to tile regions of the substrate. Also included are the steps of comparing a preferred tile region signal array with a corresponding scanned tile region and generating, for presentation to an AOI system, distortion vector signals indicative of a variation in scanned pixel location from the preferred pixel location.

DETAILED DESCRIPTION OF THE PREFERRED EMBODIMENT

Figure 1:
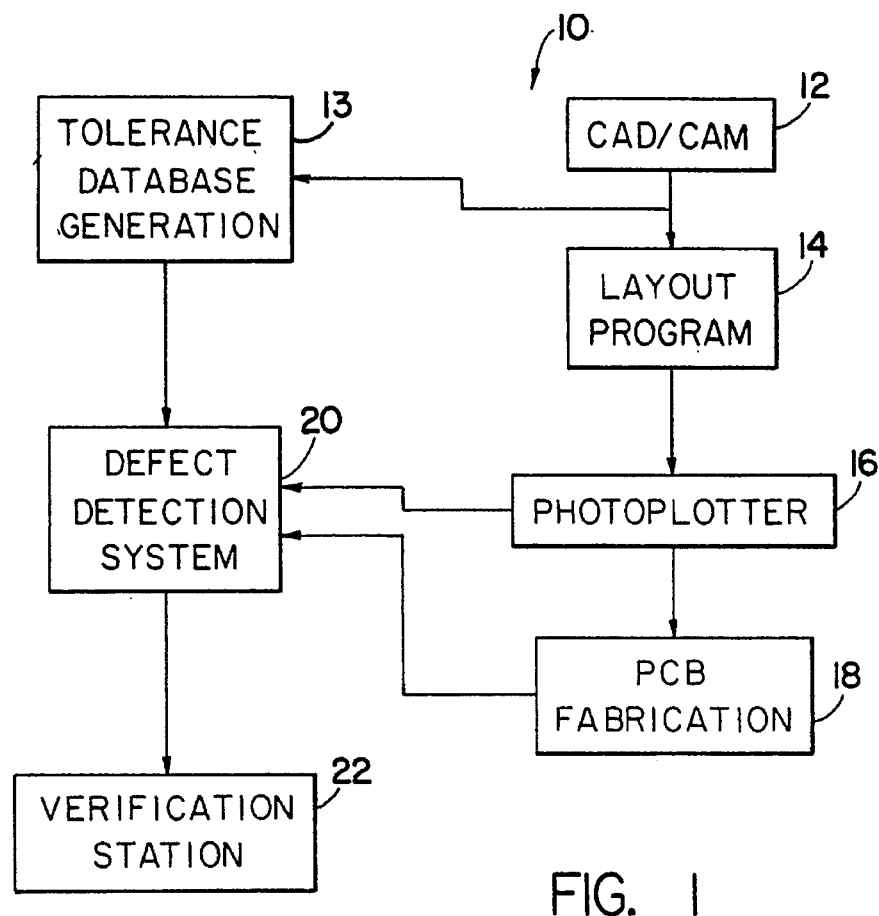
FIG. 1 is a simplified perspective drawing illustrating several devices used in the fabrication of a printed circuit board (PCB).

In FIG. 1 there is shown in simplified schematic form a series of devices representative of an overall system 10 used in the fabrication of a printed circuit board. Typically, the circuits to be fabricated on the printed circuit board (PCB) are generated using a CAD/CAM apparatus (block 12) which generates a data file containing a schematic of the layout of the PCB circuits. The circuits are configured as geometric features in the CAD/CAM data file. These features are comprised of a series of primitives such as circles, rectangles, etc. Each feature is created from the original CAD data by interpreting the CAD data commands to "flash" or "draw" in conjunction with the CAD data apertures. A "flash" command places an aperture in a single location while a draw command moves an aperture from a start to a stop position filling in along the way. The CAD data is generated in a vector manner.

At Block 14 this data file is input to a processor which generates the physical layout for the printed circuit board. The size of the corresponding data file is quite large, so most systems will use one of several known techniques to compress the data. These techniques include a variety of run length encoded (RLE) or equivalent formats. This data file is then provided to a series of devices, including a photoplotter 16 used to fabricate the artwork necessary to make the printed circuit board. The photoplotter is typically a laser direct imager (LDI). The LDI moves the exposing laser beam scanning spot with respect to a write platen and modulates the beam off and on as commanded by the input data. After the line is drawn, the platen is moved by an amount equal to the resolution (i.e. ½ mil.) and the next line is drawn. The process continues until the entire image is exposed on to the film. For a full sized PCB image there will be 52,000 scans each consisting of 40,800 bits, 5000 bytes or 2500, 16 bit words. Lastly, at block 18 the printed circuit board is fabricated using known equipment.

In order to test the printed circuit board for defects, a toleranced version of the CAD data in the form of a compressed data file 13 is provided to a printed circuit board defect detection system (AOI system) 20, such as the model 1850 defect detection system referenced above. As detailed hereinafter, the model 1850 will decompress the data back to raster format to generate a reference image of the printed circuit board. This image is used with the present system to compare against a scanned image of the printed circuit board to locate defects which can be subsequently be verified at verification station 22.

Figure 2:
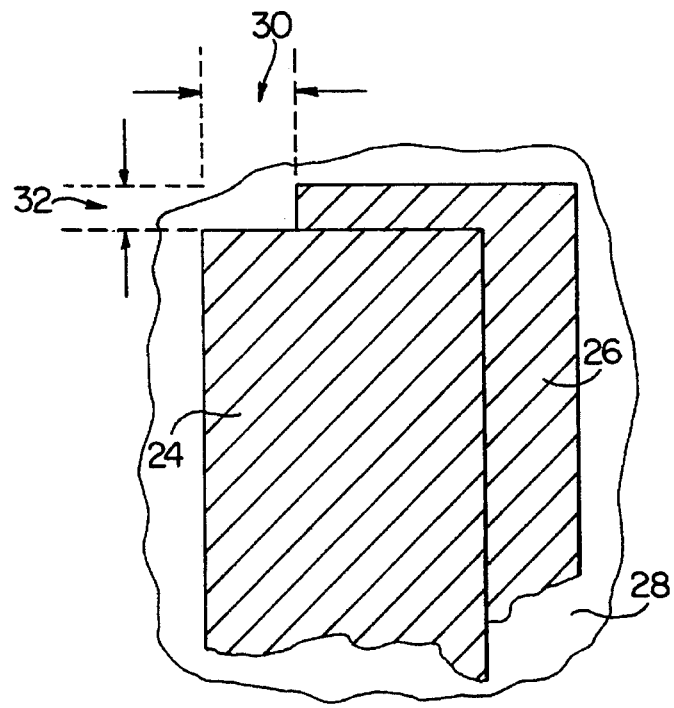
FIG. 2, is a simplified schematic illustration of a drawn line feature for printed circuit board artwork

Referring now to FIG. 2, there is shown a simplified schematic illustration of a drawn line feature for printed circuit board artwork extending over a plurality of pixels and several scan lines. As noted above, a CAD data base contains a digital image of the line as well as the other features in the printed circuit board, with each feature encompassing preselected pixels that have a given address or location within the area of the printed circuit board artwork. In FIG. 2, this is represented as feature 24. Each pixel has a center location that is spaced a preselected amount from adjacent pixels. Substrate distortion changes that spacing. If the distortion extends across the substrate, even a small distortion will result in whole substrates or circuits on substrates generating false error signals simply because of the cumulative effect of the distortion across the panel. The larger the panel, the more sensitivity there is to distortions.

During the optical inspection process the artwork is scanned, resulting in a scanned image shown as feature 26 on substrate 28. If the pixel center locations are, for example, slightly displaced from the ideal, the actual printed circuit board feature will be displaced relative to its preferred position. In FIG. 2, the scanned feature 26 lies a distance 30, 32 equal to two pixels to the left and one pixel upward relative to the CAD feature 24. Known AOI systems would return an error for the scenario shown in FIG. 2 after a comparison between scanned and CAD data since the pixel center locations in the CAD and scanned data are sufficiently different.

Figure 3:
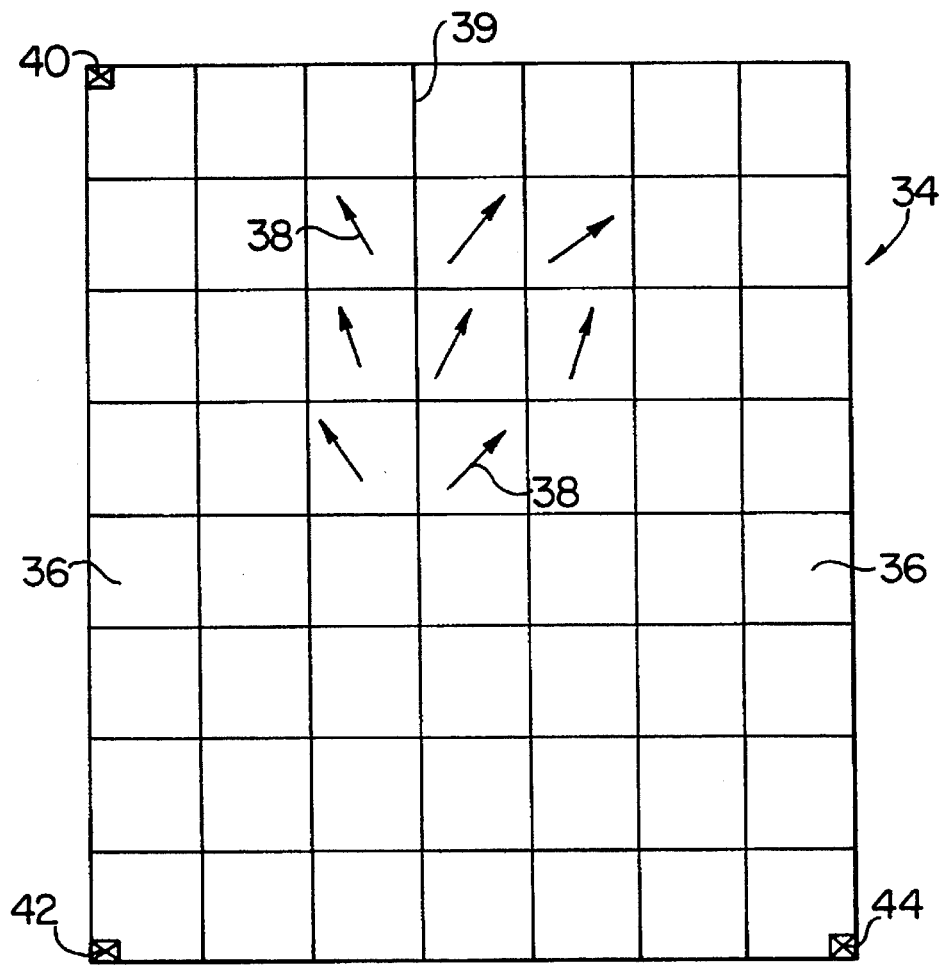
FIG. 3 is a simplified illustration of a PCB whose surface has been configured into a plurality of tile regions having local distortion vectors as computed by an automatic optical inspection system provided in accordance with the present invention.

The present invention avoids this problem by dividing the panel or substrate 34 in FIG. 3 into a plurality of tiles 36 each of whose dimension is, in the preferred embodiment, roughly one inch by one inch. The present system determines what is the best fit using a comparison between selected pixels scanned from the substrate and those corresponding pixels from the CAD database. A local distortion vector 38 is generated for each tile which is then used to compile a distortion map of the panel or substrate used for sample inspection. The system generates a correction factor for each tile stored, preferably in look up table format. In FIG. 2, the local distortion lies along tile edge 39 and could be caused, for example, be a ridge or valley in the substrate.

The pixel to pixel comparison inspection methodology is desirable for transition based AOI systems and requires the scanned image to accurately match the CAD image. Opens, shorts, "mousebites", protrusions, pinholes, splashes are all true defects which should trigger an error signal. Over and undersized features should as well, as should misplaced features below a threshold. Most PCB manufacturers do not classify misplaced features as real defects, provided placement is within a given tolerance. Feature space tolerance is typically much larger than the feature size tolerance, and is dictated by layer to layer considerations. The preferred system preserves the CAD reference pixel to pixel comparison and tolerates distorted samples.

Prior art systems compensated for global distortion by employing a technique known as "rubber sheeting" of CAD data. This technique involves scanning predefined registration points on each substrate prior to inspection. The scanned images are compared against CAD images of the registration points to compute precise panel placement and a global distortion value. Three registration points, such as points 40–44, are placed on panel boundaries. During inspection, the system automatically scans each point and the system computes a value for linear stretch and shrink. This process requires approximately 20 seconds. Extending this technique to determine local distortion is impractical. Assuming a one inch tile grid, an 18 by 24 inch panel and 5 seconds to scan and process each registration point, more than thirty minutes would be needed. In reality, more time would be required given the manual selection of these points.

The present compensation system supplements the global distortion correction techniques and is designed to be easily integrated into existing AOI processes. After a global compensation has been performed, panel or substrate imagery is acquired by scanning in one inch tiles. During scanned and CAD data comparison, selected groups of signals in the CAD database are shifted in position along the scan line by an amount approximately equal to the tile distortion vector. The shifted and scanned data are compared again. For each tile, the process is repeated until a best fit has been achieved such that a scanned to CAD data comparison will be free of displacement error. The final amount of pixel shift that constitutes the compensation is retained for the distortion map.

Those skilled in the art will note that a distortion map can be used as well to indicate problems in the PCB manufacturing processes. That is, a calibrated substrate or the like with known features can be scanned with the present invention. Any deviation from ideal feature location is indicative of a defect in the fabrication process. For example, simple lateral distortion may be indicative of equipment which is now out of tolerance.

Figure 5:
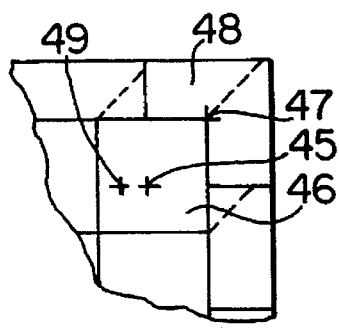
FIG. 5 is a schematic illustration of a portion of a scanned PCB tile and associated CAD pixel signals as used by a system provided according to the present invention.

For a typical PCB, pixel size is 0.0005 inch with CAD tiles or "patches" 2000 pixels in the X direction (down a "stripe") and 2016 pixels in the Y direction (across a "stripe"). Scan tiles are 2032 pixels in the X direction and 2048 pixels in the Y direction. The present system performs a computation to determine the precise 2000 by 2016 pixel region with the scan tile that best fits the corresponding CAD data tile. If no local distortion exists, the CAD data should match the center 2000 by 2016 pixel region. If local distortion is present, the CAD data may match a region that is shifted orthogonally from the nominal position. FIG. 5 diagramatically illustrates an example. As shown therein, scan tile 46 is overlaid by CAD data tile 48. The scanned tile 46 and CAD data tile 48 each respectively comprise center pixels 45 and 47. The present system further can center the scanned and preferred tile region signal arrays about the center pixels. Distortion vector signals are computed for each array indicative of a variation in scanned pixel location from the preferred pixel location. The preferred tile region pixel array position is adjusted relative to the scanned pixel array by at least one pixel, resulting in an adjusted preferred tile region pixel array position that has a center pixel indicated by pixel 49. Thereafter, it is determined if the distortion vector signals produce a variation (or deviation) at this adjusted preferred tile region pixel array position which is of a lesser magnitude than the variation that is computed at the centered, preferred tile region pixel array position; with the system selecting that position with the least variation, thereby removing the pixel location variation.

Figure 4A:
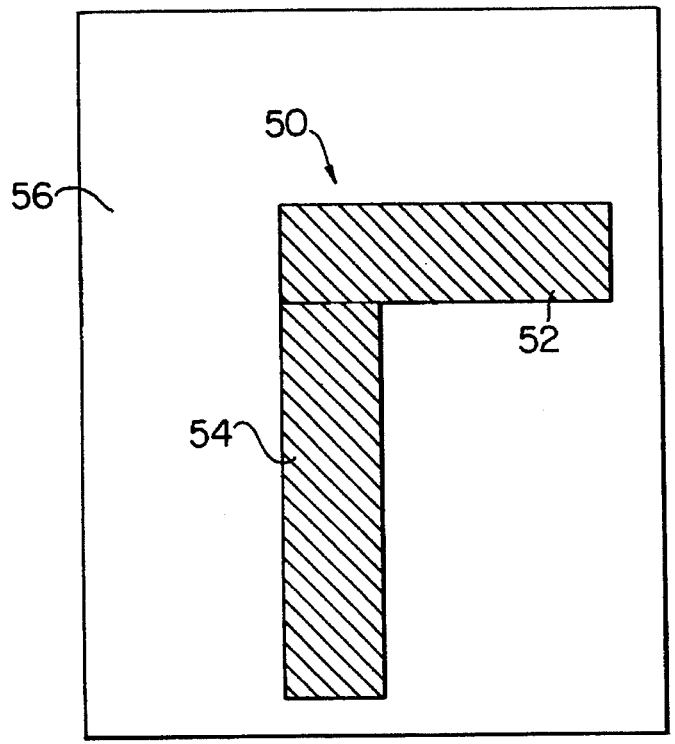
FIGS. 4a, 4b and 4c are, respectively, a simplified illustration of a PCB element feature and associated horizontal and vertical histograms computed by a system provided according to the present invention.
Figure 4C:
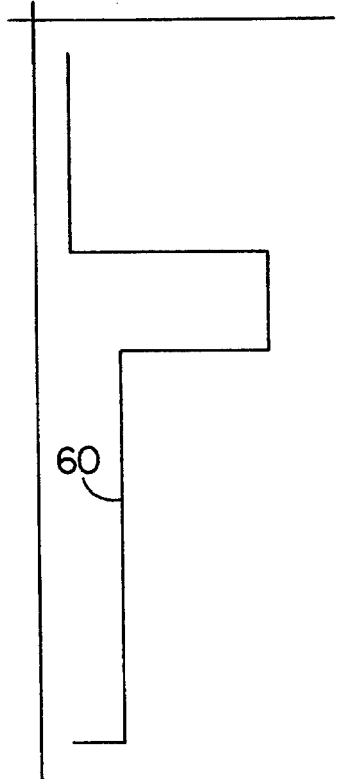
Figure 4B:
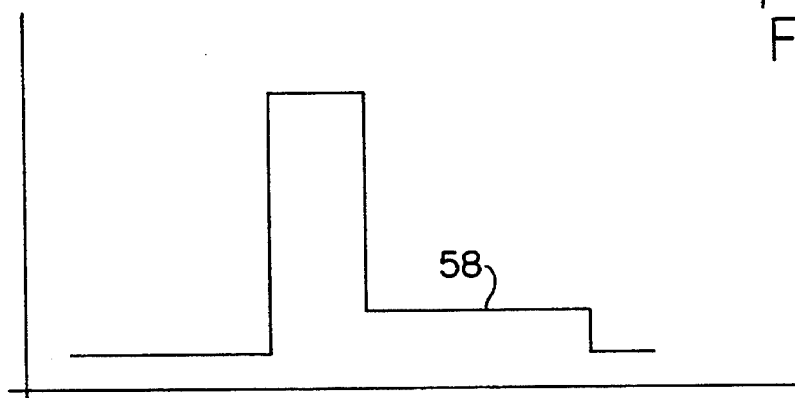

In the interests of throughput, the present invention employs two orthogonal one dimensional histograms of the two dimensional images. FIGS. 4a–4c show this process. Feature 50 comprises line elements 52, 54 extending at right angles to one another within a region 56 of a substrate. Black pixel counts for each horizontal row are summed to form a histogram for the X axis while black pixel counts for each column are summed to form a histogram for the Y axis, respectively illustrated by curves 58 and 60. The X and Y histograms are cross correlated to determine an optimum shift for a best fit. To increase throughput for a given inspection, CAD image projections are precalculated and stored with the reference image database. Also for throughput, the maximum pixel shift can be set to less than 16 pixels to limit the cross correlation search space. Other techniques, including a two dimensional best fit algorithm, can be substituted.

A single PCB "stripe" is form by a plurality of tiles or patches in a single direction across the substrate. Stripe processing is performed on a tile by tile basis. For each tile, distortion compensation is performed followed by pixel to pixel comparison. The CAD data signals form the reference or master tiles and are configured not to overlap. Scan tile signals share the same X center with their corresponding CAD tiles but overlap in the X direction to accommodate shifting from the nominal. The stripe length is extended, in the preferred embodiment, by 16 pixels at the beginning and end to allow shifting from the nominal position for the first and final tile.

The preferred embodiment is configured to determine the distortion during the scan of the substrate, although distortion could be equivalently determined during a prescan. Distortion compensation is performed either in a "learn" mode where distortion is computed only for a first substrate or panel in a lot. Data form the first substrate are stored and reused for the lot remainder. Alternatively, distortion compensation can be performed for each or only some substrates in a given lot. Operating mode is manually selectable while the system is functioning.

Figure 6:
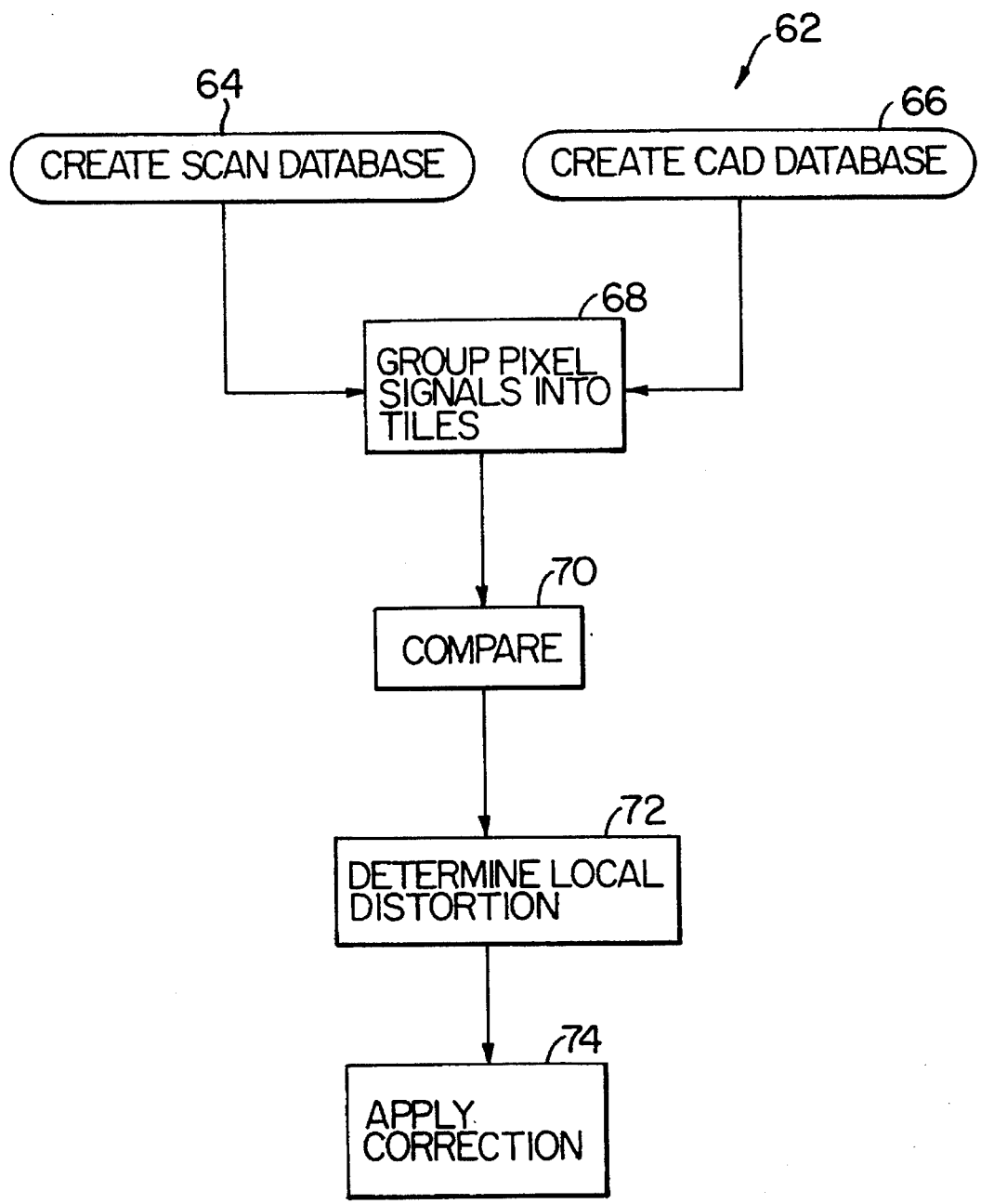
FIG. 6 is a diagrammatic illustration of an algorithm executed by an automatic optical inspection system provided in accordance with the present invention.

The overall operation of the present compensation system is shown diagramatically in FIG. 6. Algorithm 62 is executed for each tile in a substrate. Initially, the substrate is scanned to create a scan database 64. CAD database 66 containing the features fabricated on the PCB has been previously created. The signals in both the CAD and scan databases are grouped into tiles with each tile centered about a common origin. As noted above, the scan files are slightly larger in size than the corresponding CAD database (block 68). The scan and database signals for each tile are compared using the above histogram analysis (block 70) and a local distortion vector is computed at block 72. Thereafter, a correction factor for scan lines within the tile are combined with the CAD database signals before defect detection for that substrate as well as other substrates in that lot, should the operator so choose (Block 74).

Similarly, although the invention has been shown and described with respect to a preferred embodiment thereof, it should be understood by those skilled in the art that various other changes, omissions and additions thereto may be made therein without departing from the spirit and scope of the present invention.

We claim:

1. A method of substrate distortion compensation for use in an automatic optical inspection (AOI) system, said method comprising the steps of:

receiving pixel signals indicative of a database of features of preferred dimension and location to be fabricated on said substrate, said preferred dimension database signals including signals corresponding to pixels spaced across said substrate in a sequence of scan lines, with said features demarked by pixel state transitions;

grouping said preferred dimension database signals into a plurality of signal arrays corresponding to tile regions of said substrate;

receiving pixel signals indicative of a database of features scanned from said substrate;

grouping said scanned database signals into a plurality of signal arrays corresponding to tile regions of said substrate;

comparing a preferred tile region signal array with a corresponding scanned tile region;

generating distortion vector signals indicative of a variation in scanned pixel location from said preferred pixel location; and generating signals for presentation to said AOI system for removing said pixel location variation during substrate defect detection.

2. The method of claim 1 wherein said preferred dimension database signal grouping step further comprises the steps of grouping said preferred dimension tile region signals into arrays having dimensions, in pixels, greater than said scanned tile region signal arrays.

3. The method of claim 1 wherein said scanned and preferred tile regions each comprise a center pixel and said method further comprises the steps of:

centering said scanned and preferred tile region signal arrays about said center pixels;

adjusting said preferred tile region pixel signal array position relative to said scanned pixel signal array by at least one pixel; and determining if said adjusted preferred tile region pixel array position yields a lesser magnitude of said variation than said centered preferred tile region pixel array position.

4. The method of claim 3 further comprising the steps of computing histogram signals indicative of a total value of feature enabled pixels across a one of said tile region dimensions.

5. The method of claim 4 further comprising the steps of generating said histogram signals for each orthogonal direction of said tile regions.

6. The method of claim 5 further comprising the steps of selecting an adjusted tile region pixel array position in dependence on which of said adjusted tile region pixel array positions yields maximum correlation in said computed histogram total values.

7. A substrate distortion compensation apparatus for use in an automatic optical inspection (AOI) system, said apparatus comprising:

a means for receiving pixel signals indicative of a database of features of preferred dimension and location to be fabricated on said substrate, said preferred dimension database signals including signals corresponding to pixels spaced across said substrate in a sequence of scan lines, with said features demarked by pixel state transitions;

a means for grouping said preferred dimension database signals into a plurality of signal arrays corresponding to tile regions of said substrate;

a means for receiving pixel signals indicative of a database of features scanned from said substrate;

a means for grouping said scanned database signals into a plurality of signal arrays corresponding to tile regions of said substrate;

a means for comparing a preferred tile region signal array with a corresponding scanned tile region;

a means for generating distortion vector signals indicative of a variation in scanned pixel location from said preferred pixel location; and a means for generating signals for presentation to said AOI system for removing said pixel location variation during substrate defect detection.

8. The apparatus of claim 7 wherein said preferred dimension database signal grouping step further comprises the steps of grouping said preferred dimension tile region signals into arrays having dimensions, in pixels, greater than said scanned tile region signal arrays.

9. The apparatus of claim 7 wherein said scanned and preferred tile regions each comprise a center pixel, said apparatus further comprising:

a means for centering said scanned and preferred tile region signal arrays about said center pixels;

a means for adjusting said preferred tile region pixel signal array position relative to said scanned pixel signal array by at least one pixel; and a means for determining if said adjusted preferred tile region pixel array position yields a lesser magnitude of said variation than said centered preferred tile region pixel array position.

10. The apparatus of claim 9 further comprising a means for computing histogram signals indicative of a total value of feature enabled pixels across a one of said tile region dimensions.

11. The apparatus of claim 10 further comprising a means for generating said histogram signals for each orthogonal direction of said tile regions.

12. The apparatus of claim 11 further comprising a means for selecting an adjusted tile region pixel array position in dependence on which of said adjusted tile region pixel array positions yields maximum correlation in said computed histogram total values.

13. An article inspected using a method of substrate distortion compensation in an automatic optical inspection (AOI) system, said method comprising the steps of:

receiving pixel signals indicative of a database of features of preferred dimension and location to be fabricated on said substrate, said preferred dimension database signals including signals corresponding to pixels spaced across said substrate in a sequence of scan lines, with said features demarked by pixel state transitions;

grouping said preferred dimension database signals into a plurality of signal arrays corresponding to tile regions of said substrate;

receiving pixel signals indicative of a database of features scanned from said substrate;

grouping said scanned database signals into a plurality of signal arrays corresponding to tile regions of said substrate;

comparing a preferred tile region signal array with a corresponding scanned tile region;

generating distortion vector signals indicative of a variation in scanned pixel location from said preferred pixel location; and generating signals for presentation to said AOI system for removing said pixel location variation during substrate defect detection.

14. A method for use in calibrating PCB fabrication apparatus comprising the steps of:

generating a calibration substrate having features of preferred dimension and location, said features including pixels spaced across said calibration substrate in a sequence of scan lines, with said features demarked by pixel state transitions;

receiving pixel signals indicative of a database of features of preferred dimension and location to be fabricated on said calibration substrate receiving pixel signals indicative of a database of features scanned from said calibration substrate;

grouping said scanned database signals into a plurality of signal arrays corresponding to tile regions of said substrate;

comparing a preferred tile region signal array with a corresponding scanned tile region;

generating, for presentation to said PCB fabrication apparatus, distortion vector signals indicative of a variation in scanned pixel location from said preferred pixel location; and generating for presentation to said PCB fabrication apparatus calibration signals that remove said pixel location variation.

* * * * *